United States Patent
Matsuse

(10) Patent No.: US 7,562,237 B2
(45) Date of Patent: *Jul. 14, 2009

(54) SEMICONDUCTOR INTEGRATED CIRCUIT DEVICE WITH INTERNAL POWER CONTROL SYSTEM

(75) Inventor: Shuhsaku Matsuse, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/846,546

(22) Filed: Aug. 29, 2007

(65) Prior Publication Data

US 2008/0136469 A1    Jun. 12, 2008

(30) Foreign Application Priority Data

Dec. 7, 2006    (JP)    ............................. 2006-330226

(51) Int. Cl.
*G06F 1/26* (2006.01)
(52) U.S. Cl. ............................. 713/300; 327/112; 716/1
(58) Field of Classification Search ................. 713/300; 716/1, 19; 327/112, 151
See application file for complete search history.

(56) References Cited

U.S. PATENT DOCUMENTS

| | | | | |
|---|---|---|---|---|
| 5,914,631 A * | 6/1999 | Soneda | ........................ | 327/535 |
| 6,667,651 B2 * | 12/2003 | Hashiguchi | ................. | 327/538 |
| 6,924,679 B2 * | 8/2005 | Seno et al. | ................... | 327/158 |
| 2007/0096781 A1 * | 5/2007 | Ito | .............................. | 327/112 |
| 2008/0034263 A1 * | 2/2008 | Matsuse | ..................... | 714/731 |

FOREIGN PATENT DOCUMENTS

| | | |
|---|---|---|
| JP | 2005-045172 A1 | 2/2005 |
| JP | 2005-322860 A1 | 11/2005 |
| JP | 2006-120686 * | 5/2006 |

* cited by examiner

*Primary Examiner*—Chun Cao
(74) *Attorney, Agent, or Firm*—William D. Sabo; Shimokaji & Associates, P.C.

(57) ABSTRACT

One object of the present invention is to provide an LSI that can dynamically perform appropriate adjustment for a power voltage to be supplied to an internal circuit, not only at the time of the occurrence of the initial change of a performance due to a variation or variety factors through a manufacturing process, but also at the time of the occurrence of the time elapsed change. An LSI 13 includes a semiconductor substrate 14, a ring oscillator 17 formed on the semiconductor substrate 14 and for outputting a monitoring clock signal MCLK having a frequency that depends on a manufacturing process, an internal circuit 16 formed on the semiconductor substrate 14; a frequency comparison circuit 18 for comparing the monitoring the clock signal MCLK with a reference clock signal RCLK having a predetermined frequency, and for outputting a differential signal DIF corresponding to the difference between the frequencies; and an internal power supply circuit 19 for supplying an internal power voltage IVDD to the internal circuit 16 corresponding to the differential signal DIF that is outputted by the frequency comparison circuit 18.

3 Claims, 11 Drawing Sheets

34 OR 35

SEMICONDUCTOR INTEGRATED CIRCUIT DEVICE WITH INTERNAL POWER CONTROL SYSTEM

CROSS REFERENCE TO RELATED APPLICATIONS

This application is related to Japanese Patent Application No. 2006-330226 filed Dec. 7, 2006.

FIELD OF THE INVENTION

The present invention relates to a semiconductor integrated circuit device and an internal power control system including same, and relates more particularly to a semiconductor integrated circuit device that can appropriately adjust a power voltage to be supplied to an internal circuit, and an internal power control system that includes this device.

BACKGROUND OF THE INVENTION

Japanese Patent Unexamined Published Application No. 2006-120686 (Kokai) (patent document 1) discloses an LSI mounting board, the object of which is to improve the yield ratio of acceptable LSIs (Large-Scale Integrated circuits), by saving LSIs that might be abolished as defective products because they do not satisfy a frequency specification requirement or a power specification requirement due to a variation in quality or variety factors in each LSIs, and in which a circuit is provided in the LSI for detecting a fluctuation in performance due to a variation in quality in each LSIs and the output value of this circuit is employed to control a voltage supplied to the LSI. The LSI mounting board is designed such that it can satisfy both of the specification requirements for the operating frequency and the power consumption, by setting a voltage applied to an LSI, which is regarded as a defective product because its power consumption is too large although there is still a surplus in the operating frequency, so that the voltage is lower than a suitable standard value, or by setting a voltage applied to an LSI, which is regarded as a defective product because the operating frequency is low although there is still a surplus in the power consumption, so that the voltage is higher than a suitable standard value.

Specifically, an LSI mounted on the LSI mounting board includes a processor, a ring oscillator, an LSI operation velocity measurement circuit, a power control circuit and a memory control circuit. In addition to the LSI, a clock oscillator, a voltage-variable power supply circuit, a ROM and a voltage-fixed power supply circuit are provided on the LSI mounting board. The clock oscillator generates an operating clock signal for the LSI. A clock signal generated by the clock oscillator is transmitted to the individual circuits of the LSI. The voltage-variable power supply circuit supplies power to the LSI. ROM stores therein a calculated flag and the velocity value. The LSI operation velocity measurement circuit measures the output frequency of the ring oscillator. Thus, the operating velocity fluctuation value of the LSI due to a manufacturing variation or variety factors in LSIs can be obtained. Using these circuits, it is possible to know how many times in a predetermined period the output of the ring oscillator rises.

The power control circuit is composed of a register, a counter and a comparator. A velocity value required for setting the optimal voltage to be applied is set on the register. The velocity value set on the register is generated, using a value that corresponds to the operating velocity of the LSI. This velocity value can be read from or written to the processor. The counter increments a value each time a clock signal rises. The comparator compares the output of the register with the output of the counter, and outputs a power voltage control signal. The power voltage control signal is transmitted to the voltage-variable power supply circuit. When the counter value is smaller than the velocity value outputted by the register, the power voltage control signal goes to level H (logical high), or when the counter value is equal to or greater than the velocity value, the power voltage control signal goes to level L (logical low). The voltage outputted by the voltage-variable power supply circuit can be adjusted by changing the duty ratio of the power voltage control signal.

The processor reads the velocity value from the ROM, and writes the velocity value to the register. Through this process, an appropriate voltage to be applied to an LSI can be set for each port.

An LSI having the maximum operating frequency higher than that in the specification and power consumption larger than that in the specification may possibly turn into a good product, by reducing a voltage applied to the LSI so that the power consumption for the LSI becomes lower than that in the specification requirement. Furthermore, an LSI having the maximum operating frequency lower than that in the specification requirement and power consumption smaller than that in the specification requirement may possibly turn into a good product, by increasing a voltage to be applied needed so that the maximum operating frequency becomes higher than that in the specification requirement.

However, since the process for calculating the applied voltage is performed only once at the time of product shipping inspection, and the value obtained at this time is thereafter employed, only the initial change of the performance due to a variation or variety factors through the manufacturing process can be coped with, while a time-transient change that occurs following the product shipping can not be handled. Further, since a processor, a ROM and the like are required, the circuit would become complicated and large.

SUMMARY OF THE INVENTION

One object of the present invention is to provide a semiconductor integrated circuit device that can dynamically perform appropriate adjustment for a power voltage to be supplied to an internal circuit, not only at the time of the occurrence of the initial change of a performance due to the variation or variety factors through a manufacturing process, but also at the time of the occurrence of the time elapsed change, and an internal power control system that includes such a semiconductor integrated circuit device.

A semiconductor integrated circuit device according to the present invention comprises: a semiconductor substrate, an oscillator, an internal circuit, a frequency comparison circuit and an internal power supply circuit. The oscillator is formed on the semiconductor substrate, and outputs a monitoring clock signal having a frequency that depends on a manufacturing process. The internal circuit is formed on the semiconductor substrate. The frequency comparison circuit compares the monitoring clock signal outputted by the oscillator with a reference clock signal having a predetermined frequency, and outputs a differential signal corresponding to a difference between the frequencies of the monitoring clock signal and the reference clock signal. The internal power supply circuit supplies an internal power voltage corresponding to the differential signal outputted by the frequency comparison circuit, to the internal circuit.

According to the present invention, since the monitoring clock signal having a frequency that depends on the manufacturing process is compared with the reference clock signal having a predetermined frequency, and an internal power voltage to be supplied to the internal circuit is controlled in accordance with the difference between the frequencies, appropriate adjustment for the internal power voltage can be dynamically performed not only when the initial change of the performance has occurred due to the variation or the variety factors through the manufacturing process, but also when the time elapsed change has occurred.

Preferably, the frequency comparison circuit includes a pulse thinning circuit, a frequency dividing circuit, a differentiating circuit and a pulse number comparison circuit. The pulse thinning circuit outputs a thinned-out clock signal by thinning out (n−2) pulses for every n pulses included in the reference clock signal, and maintaining two pulses. The frequency dividing circuit frequency-divides the monitoring clock signal to a 1/n frequency thereof, and outputs a frequency-divided clock signal. The differentiating circuit differentiates, in synchronization with the reference clock signal, the frequency-divided clock signal outputted by the frequency dividing circuit, and outputs a differentiated clock signal. The pulse number comparison circuit compares the number of pulses of the thinned-out clock signal outputted by the pulse thinning circuit with the number of pulses of the differentiated clock signal outputted by the differentiating circuit, and generates a differential signal in accordance with the obtained difference.

In this case, since the reference clock signal and the monitoring clock signal, for which the frequency and the phase differ are different, are compared, the differential signal can be generated corresponding to the difference of the frequencies.

An internal power control system according to the present invention comprises a semiconductor integrated circuit device. The semiconductor integrated circuit device includes a semiconductor substrate, an oscillator and an internal circuit. The oscillator is formed on the semiconductor substrate, and outputs a monitoring clock signal having a frequency that depends on a manufacturing process. The internal circuit is formed on the semiconductor substrate. The internal power control system further comprises a frequency comparison circuit and an internal power supply circuit. The frequency comparison circuit compares a monitoring clock signal outputted by the oscillator with the reference clock signal having a predetermined frequency, and outputs a differential signal corresponding to a difference between the frequencies of the monitoring clock signal and the reference clock signal. The internal power supply circuit supplies an internal power voltage corresponding to a differential signal outputted by the frequency comparison circuit to the internal circuit. In this case, the frequency comparison circuit and the internal power supply circuit may be provided either inside or outside the semiconductor integrated circuit device.

According to the present invention, the monitoring clock signal having a frequency that depends on the manufacturing process is compared with the reference clock signal having the predetermined frequency, and the internal power voltage to be applied to the internal circuit is controlled in accordance with the difference between the frequencies. Therefore, appropriate adjustment of the internal power voltage can be dynamically performed not only when the initial change of a performance has occurred due to the variation or the variety factors through the manufacturing process, but also when the time elapsed change has occurred.

DETAILED DESCRIPTION OF THE INVENTION

Figure 1:
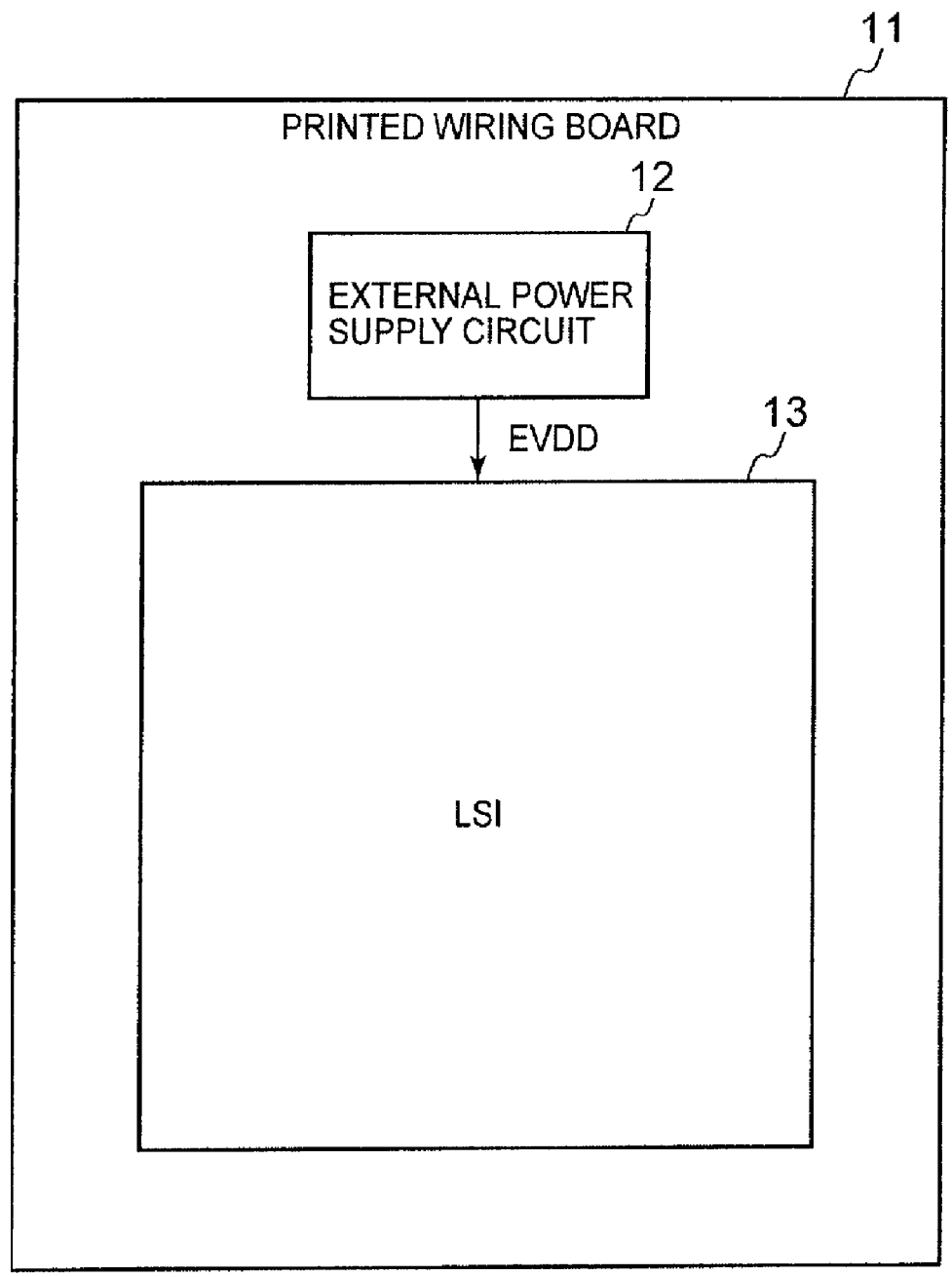
FIG. 1 is a functional block diagram showing the general configuration of an internal power control system according to a first embodiment of the present invention.

The embodiments of the present invention will now be described in detail with reference to the drawings. The same reference numerals are provided for the identical or corresponding parts in the drawings, and no explanation for them will be repeated.

First Embodiment

Referring to FIG. 1, an internal power control system 10 according to a first embodiment of the present invention comprises a printed wiring board 11, an external power supply circuit 12 mounted on the printed wiring board 11, and an LSI 13 mounted on the printed wiring board 11. The external power supply circuit 12 supplies a predetermined external power voltage EVDD to the LSI 13.

Figure 2:
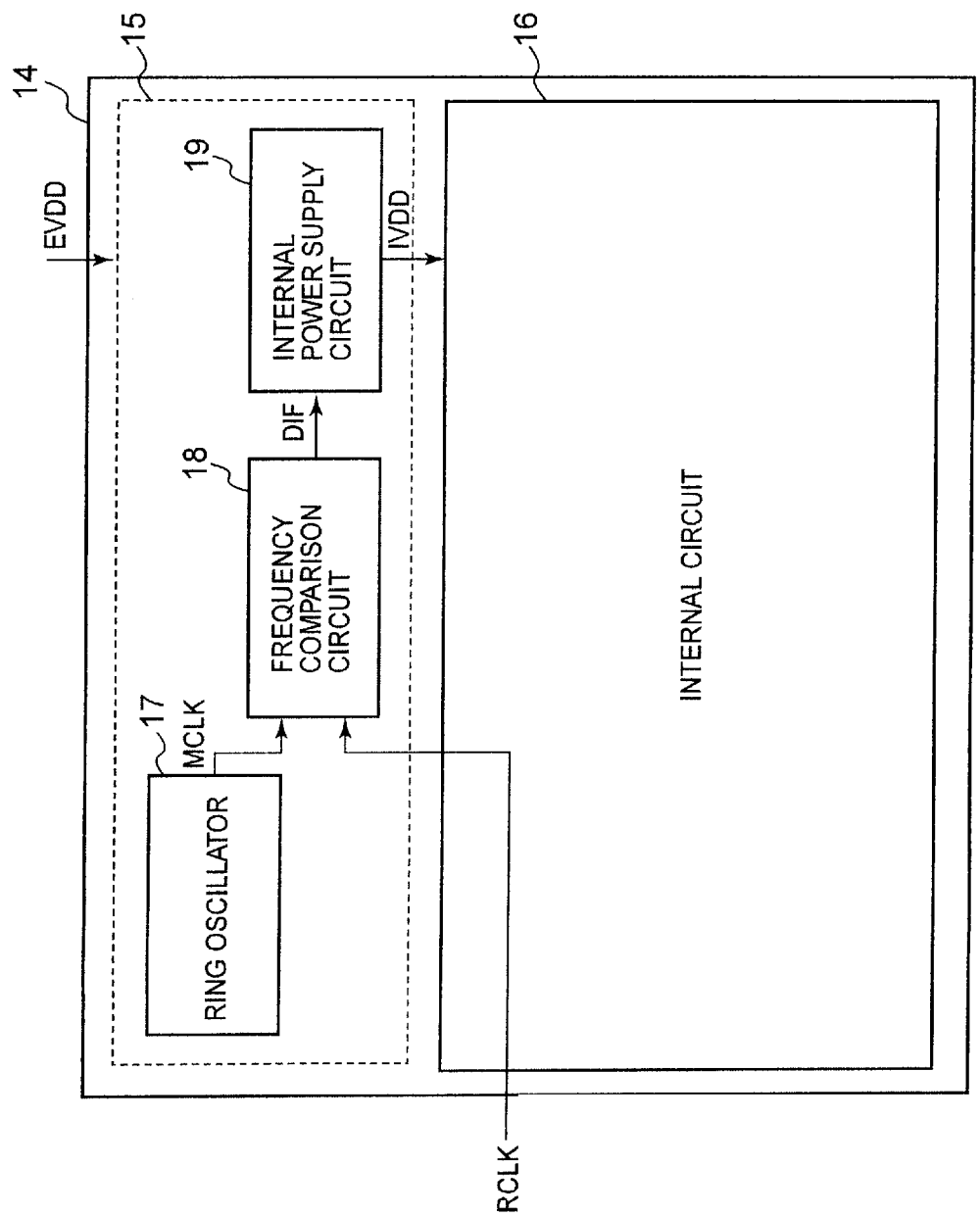
FIG. 2 is a functional block diagram showing the arrangement of the LSI shown in FIG. 1.

Referring to FIG. 2, the LSI 13 includes a semiconductor substrate 14, an internal power control circuit 15 formed on the semiconductor substrate 14, and an internal circuit 16 formed on the semiconductor substrate 14. The internal power control circuit 15 includes a ring oscillator 17, a frequency comparison circuit 18 and an internal power supply circuit 19. The internal power control circuit 15 receives the external power voltage EVDD. The internal circuit 16 is an arbitrary circuit formed inside the LSI 13.

Figure 3:
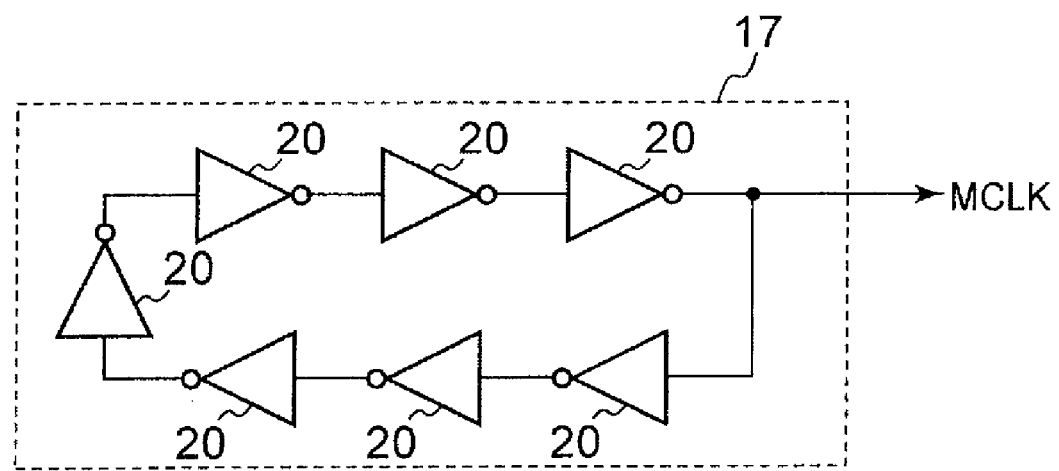
FIG. 3 is a circuit diagram showing the structure of the ring oscillator in FIG. 2.

Referring to FIG. 3, the ring oscillator 17 includes an annularly connected odd number of inverters 20. The ring oscillator 17 serves as an oscillator, which outputs a monitoring clock signal MCLK. Each of the inverters 20 includes P and N channel MOS transistors (not shown) that are formed on the semiconductor substrate 14 through the CMOS manufacturing process. Therefore, the frequency of the monitoring clock signal MCLK depends on the manufacturing process. That is, the frequency of the monitoring clock signal MCLK becomes higher, with the variation through the manufacturing process, in the case of an LSI 13 in which the power consumption is large but the operating velocity is high. On the other hand, the frequency of the monitoring clock signal MCLK becomes lower, in the case of an LSI 13 in which the power consumption is small but the operating velocity is low. In this embodiment, the design is such that the frequency of the monitoring clock signal MCLK is substantially equal to that of a reference clock signal RCLK that will be described later, in the case of an LSI 13 in which the power consumption and the operating velocity are both average. Supposing that the frequency of the reference clock signal RCLK is defined as Fs (Hz), the frequency of the monitoring clock signal MCLK is Fs+a (Hz) in the case of an LSI 13 having a high operating velocity, or Fs−a (Hz) in the case of an LSI 13 having a low operating velocity. In this case, "a" denotes a deviation of the monitoring clock signal MCLK.

Further, the ring oscillator 17 is provided using a base cell of an ASIC (Application Specific Integrated Circuit). Since the arrangement and wiring are free, the ring oscillator 17 can be located at a position where a gate delay is to be measured.

Furthermore, not only a gate delay, but also a wiring delay can be measured by appropriately devising the design.

Referring again to FIG. 2, the frequency comparison circuit 18 compares the monitoring clock signal MCLK outputted by the ring oscillator 17 with an externally provided reference clock signal RCLK, and outputs a differential signal DIF corresponding to a difference between these frequencies. The reference clock signal RCLK is a system clock signal generated by a quartz oscillator or a PLL (Phase Locked Loop) circuit, and a frequency Fs of this reference clock signal RCLK is substantially constant without being affected by a power voltage.

The internal power supply circuit 19 is constituted by, for example, a regulator or the like, and supplies an internal power voltage IVDD to the internal circuit 16. The internal power voltage IVDD changes in response to the differential signal DIF. Specifically, when the frequency of the monitoring clock signal MCLK becomes higher than the frequency of the reference clock signal RCLK, the internal power voltage IVDD falls. On the other hand, when the frequency of the monitoring clock signal MCLK becomes lower than the frequency of the reference clock signal RCLK, the internal power voltage IVDD rises.

Figure 4:
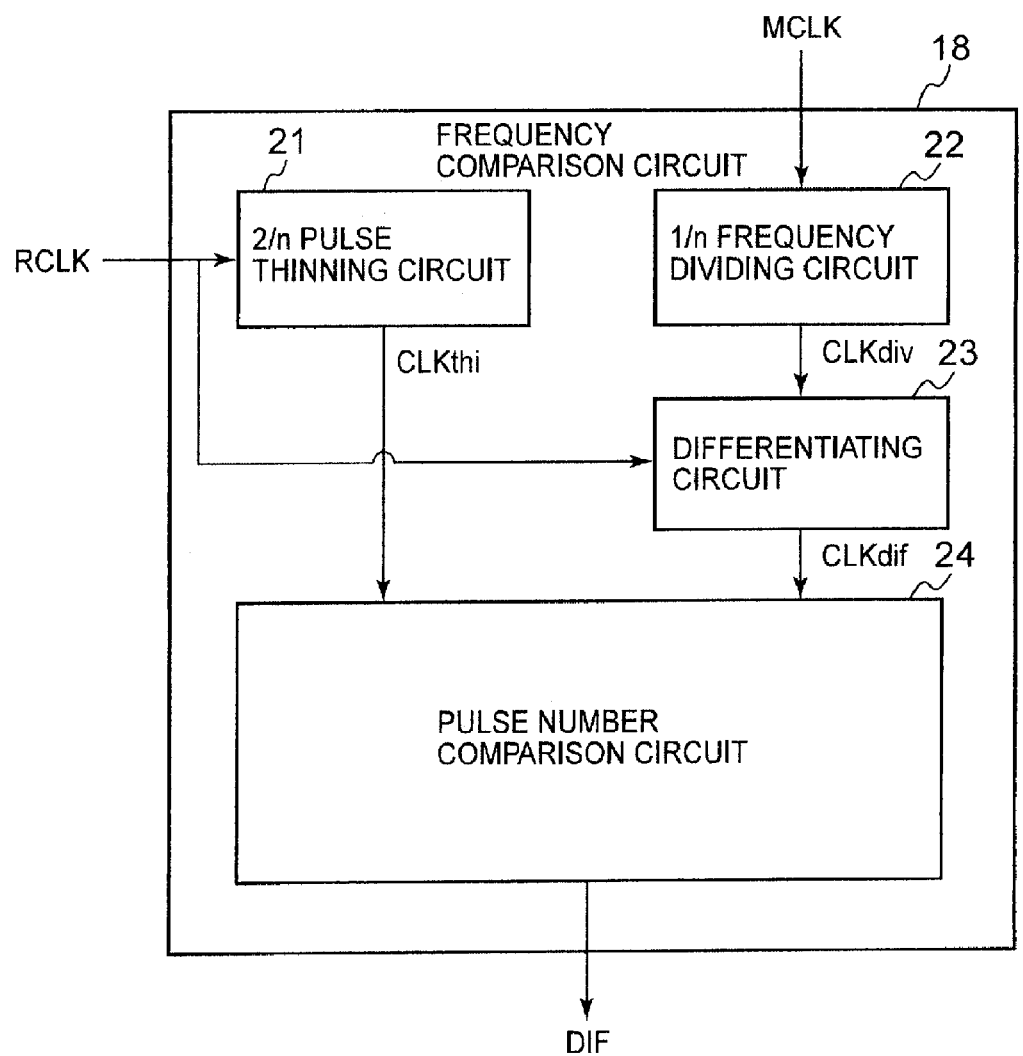
FIG. 4 is a functional block diagram showing the arrangement of the frequency comparison circuit in FIG. 2.
Figure 5:
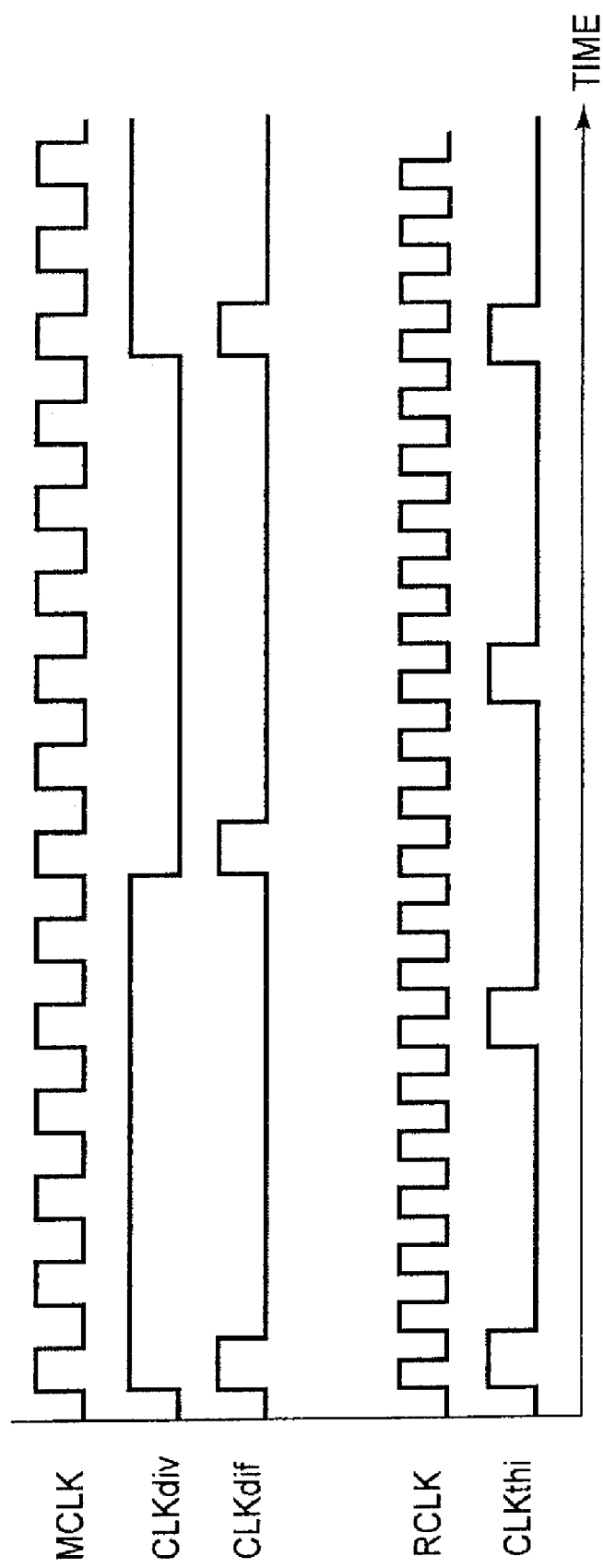
FIG. 5 is a timing chart showing the operation of the frequency comparison circuit shown in FIG. 4.

Referring to FIG. 4, the frequency comparison circuit 18 includes a 2/n pulse thinning circuit 21, a 1/n frequency dividing circuit 22, a differentiating circuit 23 and a pulse number comparison circuit 24. As shown in FIG. 5, the 2/n pulse thinning circuit 21 outputs a thinned-out clock signal CLKthi by thinning out (n−2) pulses for every n pulses included in the reference clock signal, and maintaining two pulses. The 1/n frequency dividing circuit 22 divides the monitoring clock signal MCLK to a 1/n frequency thereof, and outputs a frequency-divided clock signal CLKdiv, as shown in FIG. 5.

Figure 6:
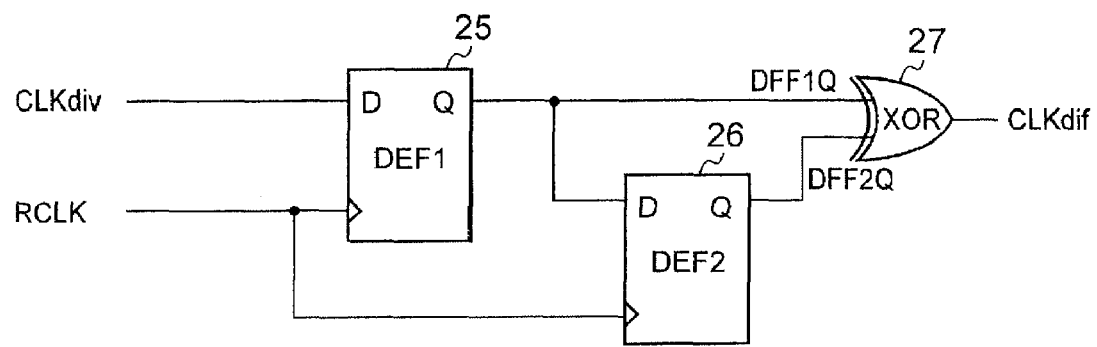
FIG. 6 is a circuit diagram showing the structure of the differentiating circuit in FIG. 4.
Figure 7:
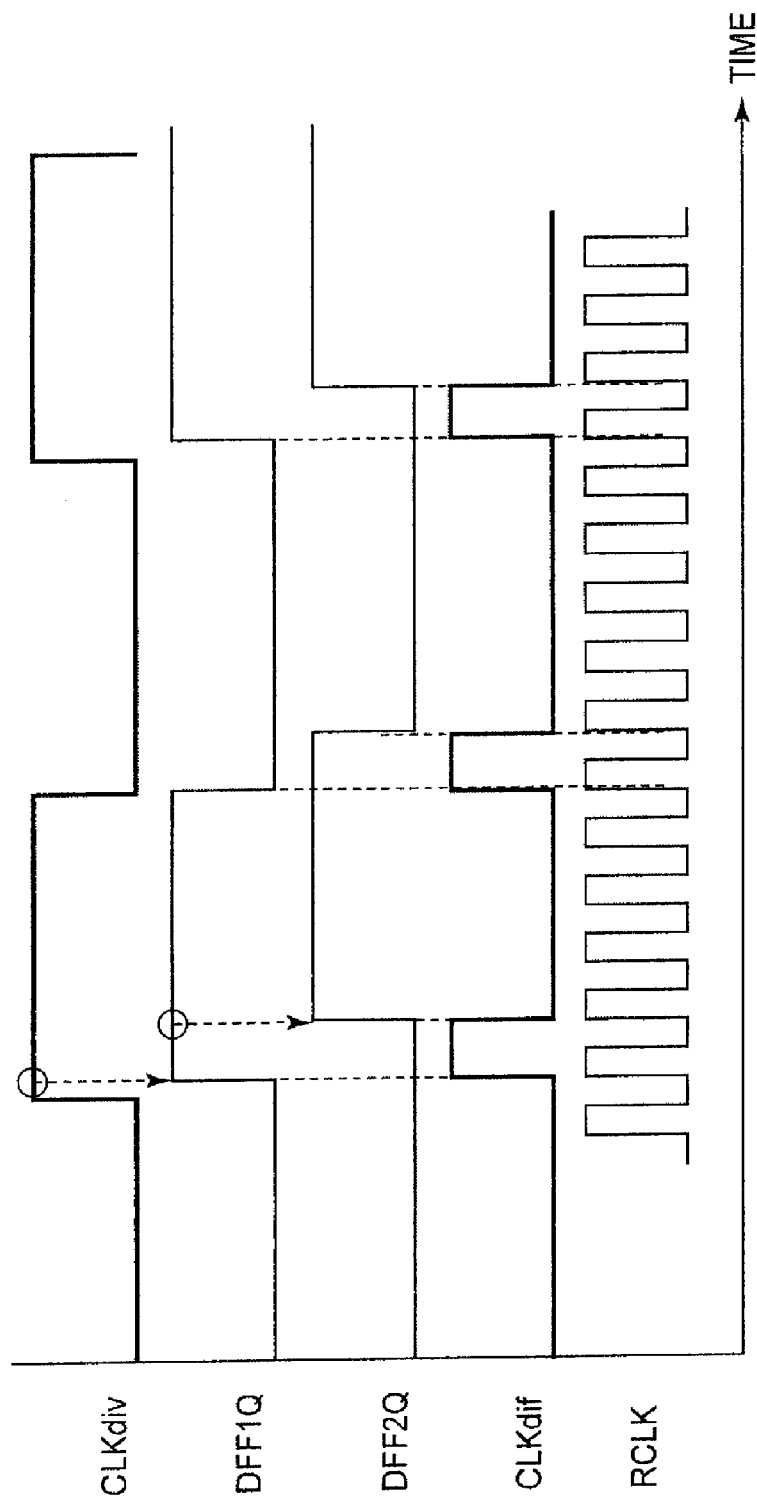
FIG. 7 is a timing chart showing the operation of the differentiating circuit in FIG. 6.

The differentiating circuit 23 differentiates the frequency-divided clock signal CLKdiv in synchronization with the reference clock signal RCLK, and outputs differentiated clock signal CLKdif, as shown in FIG. 5. The differentiating circuit 23 includes a delay flip-flop circuit (DFF1) 25, a delay flip-flop circuit (DFF2) 26 and an exclusive OR circuit (XOR) 27, as shown in FIG. 6. As shown in FIG. 7, the delay flip-flop circuit 25 latches the frequency-divided clock signal CLKdiv in synchronization with the reference clock signal RCLK, and outputs a signal DFF1Q. The delay flip-flop circuit 26 latches the signal DFF 1Q in synchronization with the reference clock signal RCLK, and outputs a signal DFF2Q. The exclusive OR circuit 27 outputs a differentiated clock signal CLKdif in response to the signals DFF1Q and DFF2Q. The pulse of the differentiated clock signal CLKdif is generated at the rise time and the fall time of the frequency-divided clock signal CLKdiv. Further, the pulse width of this signal is equal to the cycle of the reference clock signal RCLK.

As a result, since the phases of the differentiated clock signal CLKdif and the thinned-out clock signal CLKthi are aligned, and the pulse widths of the two signals are equal to each other, as shown in FIG. 5, the number of pulses of the two signals can be compared dynamically and in real time.

Referring again to FIG. 4, the pulse number comparison circuit 24 compares the number of pulses per unit hour that is included in the thinned-out clock signal CLKthi with the number of pulses per unit hour that is included in the differentiated clock signal CLKdif, and generates a differential signal DIF in response to the obtained difference. The voltage level of the differential signal DIF changes in response to the difference between the pulse numbers. Specifically, as the pulse number of the differentiated clock signal CLKdif is greater than the pulse number of the thinned-out clock signal CLKthi, the voltage level of the differential signal DIF is lowered. On the other hand, when the pulse number of the differentiated clock signal CLKdif becomes smaller than the pulse number of the clock signal CLKthi, the voltage level of the differential signal DIF is increased.

Figure 8:
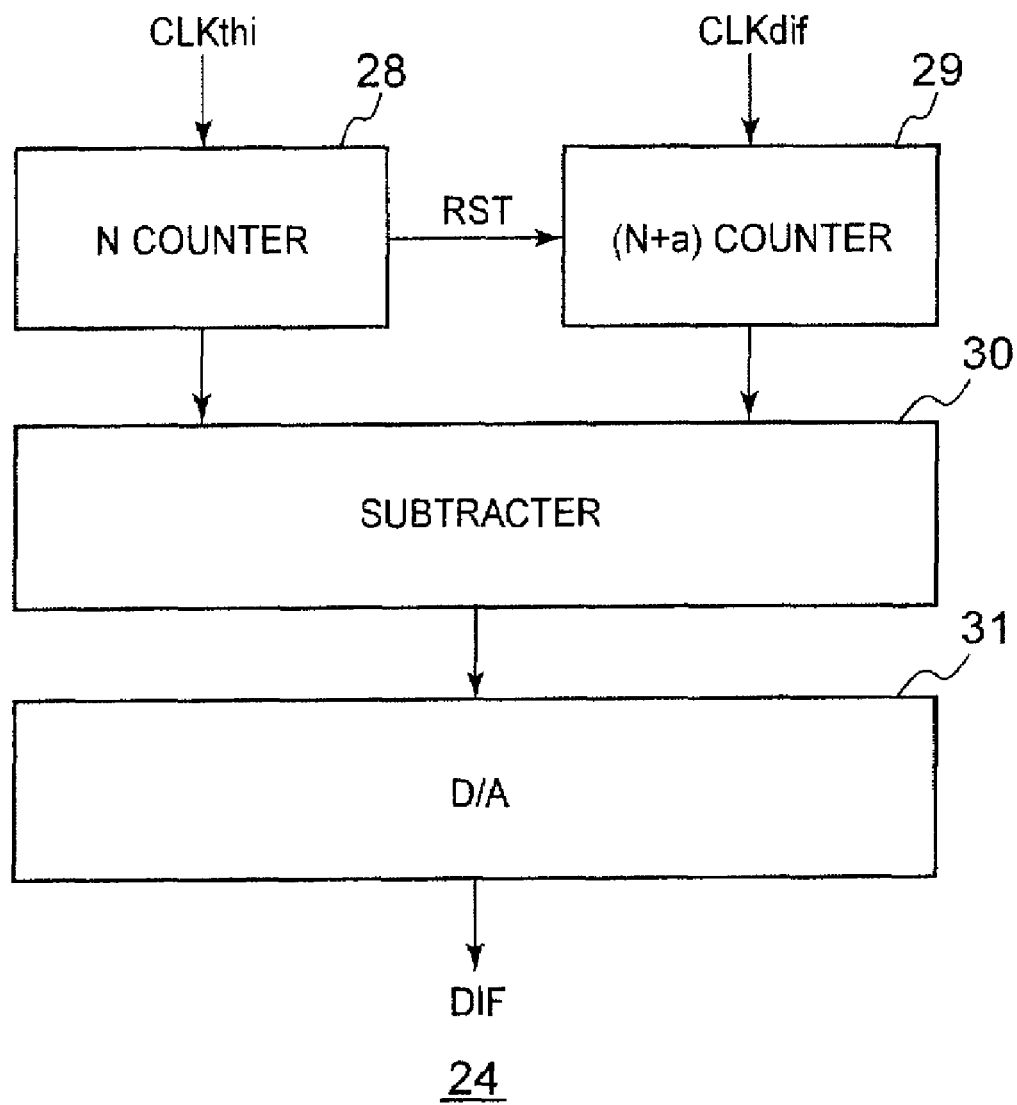
FIG. 8 is a functional block diagram showing the arrangement of the pulse number comparison circuit in FIG. 4.

Referring to FIG. 8, the pulse number comparison circuit 24 includes an N counter 28, an (N+a) counter 29, a subtracter 30 and a digital/analog converter (D/A) 31. Here, "a" denotes a deviation of the monitoring clock signal MCLK. The N counter 28 counts the number of pulses of the thinned-out clock signal CLKthi. Each time the count value reaches N, the N counter 28 is reset, and outputs a reset signal RST. The (N+a) counter 29 counts the number of pulses of the differentiated clock signal CLKdif, and is reset in response to the reset signal RST received from the N counter 28.

The subtracter 30 subtracts the pulse number held by the (N+a) counter 29 from the pulse number held by the N counter 28 immediately before the N counter 28 and the (N+a) counter 29 are reset, i.e., each time (N−1) is counted, and outputs the obtained difference. Therefore, when the count value held by the (N+a) counter 29 is smaller than the count value held by the N counter 28, the difference is a positive value. When the count value held by the (N+a) counter 29 is greater than the count value held by the N counter 28, the difference is a negative value. The D/A 31 performs D/A conversion for the pulse number difference outputted by the subtracter 30, and outputs the result as an analog differential signal DIF.

In this embodiment, the (N+a) counter is employed as the counter 29, but N counters may be employed for both counters 28 and 29. With this arrangement, since there is a case wherein the value held by the N counter 29 reaches N first and the N counter 29 is reset prior to the N counter 28, when the count value of the N counter 29 is smaller than N/2, if the subtracter 30 is constituted such that N is subtracted from a difference that is obtained by subtracting the count value of the N counter 29 from the count value of the N counter 28, the subtracter 30 can output the same value as that obtained in the above described case.

According to the above described frequency comparison circuit 18, the differential signal DIF corresponding to the difference between the frequencies can be generated, although the frequency and the phase are different between the monitoring clock signal MCLK and the reference clock signal RCLK. Further, since the frequency of the monitoring clock signal MCLK is divided, the variation of the reference clock signal RCLK can be coped with simply by changing the frequency division ratio. It should be noted that the resolution is equivalent to one cycle of the reference clock signal RCLK.

As described above, according to the first embodiment, the monitoring clock signal MCLK having a frequency that depends on the manufacturing process is compared with the reference clock signal RCLK having a predetermined frequency, and the internal power voltage IVDD to be supplied to the internal circuit 16 is controlled in accordance with the difference between the frequencies. Therefore, not only when the initial fluctuation of the performance has occurred due to the variation through the manufacturing process, but also when the time-transient change has occurred, appropriate adjustment of the internal power voltage IVDD can be dynamically performed. Furthermore, since a processor and a ROM are not required, this system can be provided using only a simple and small circuit.

Second Embodiment

Figure 9:
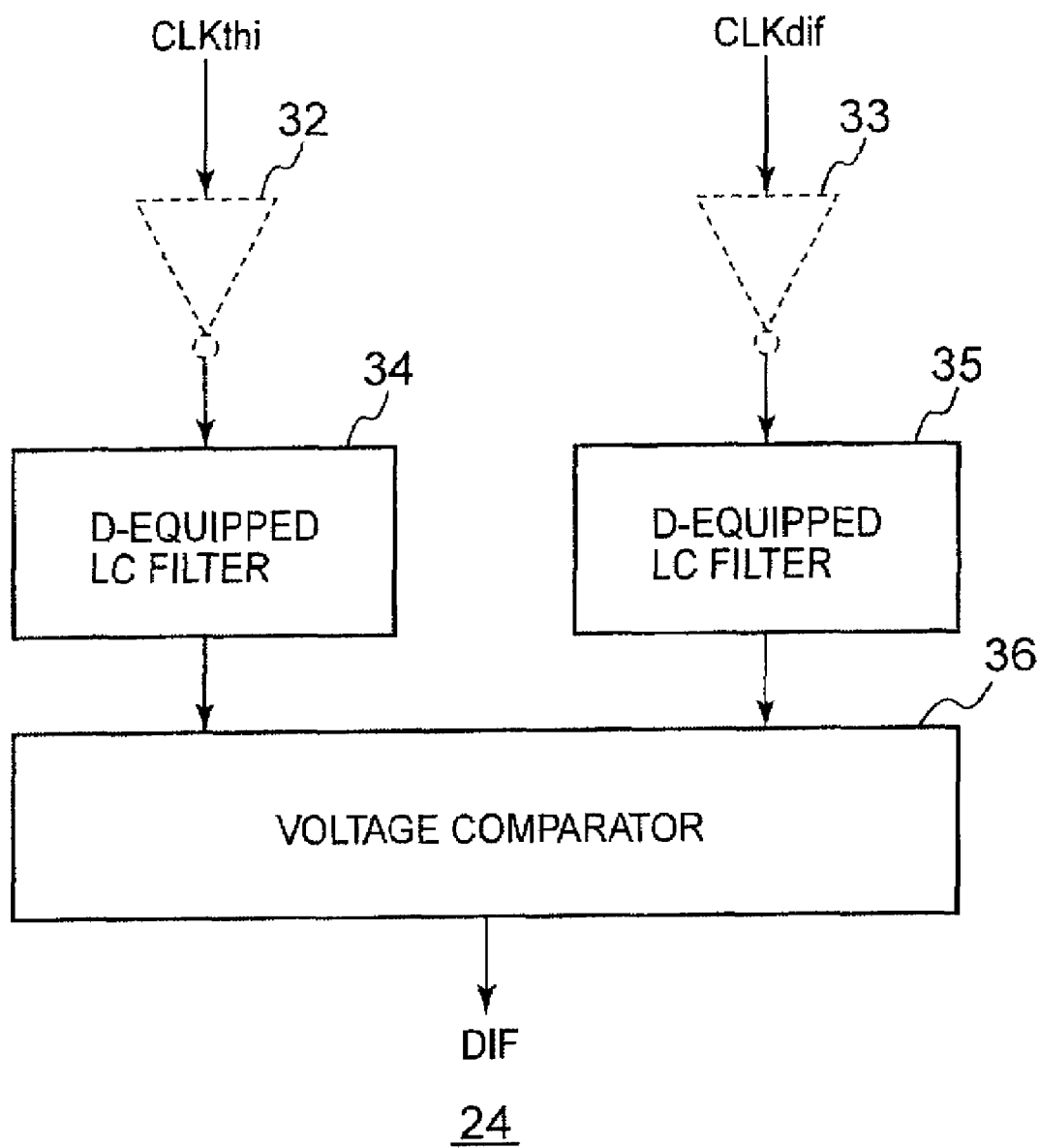
FIG. 9 is a functional block diagram showing the arrangement of the pulse number comparison circuit employed in a second embodiment of the present invention.
Figure 10:
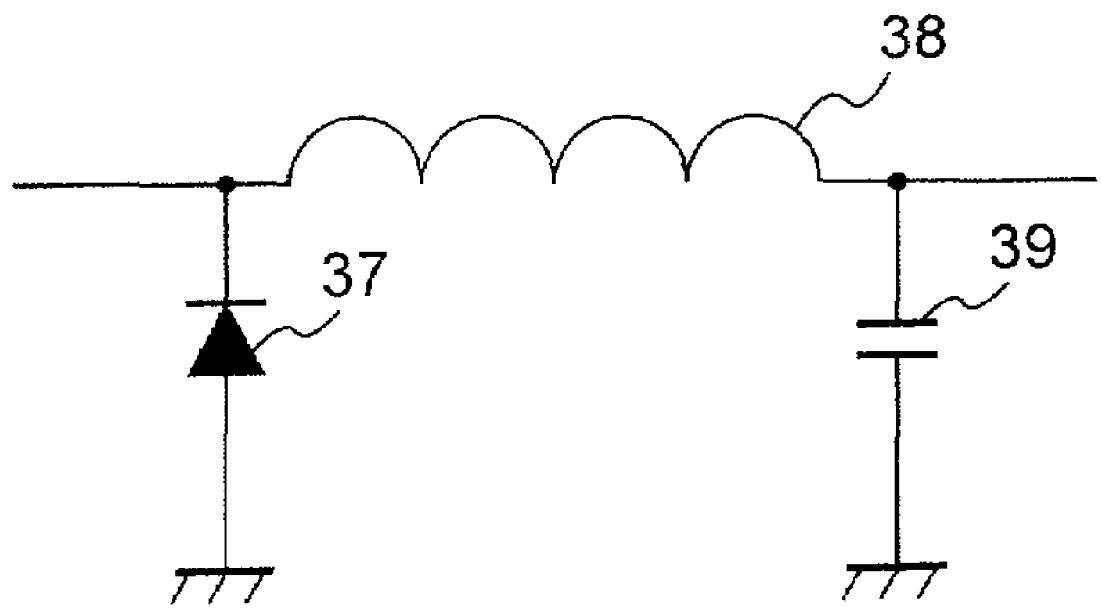
FIG. 10 is a circuit diagram showing the structure of the diode-equipped LC filter shown in FIG. 9.

A pulse number comparison circuit 24 shown in FIG. 9 may be employed instead of the pulse number comparison circuit 24 in FIG. 8. The pulse number comparison circuit 24 for the second embodiment of the invention includes diode equipped LC filters 34 and 35 and a voltage comparator 36. The LC filter 34 receives a thinned-out clock signal CLKthi, and the LC filter 35 receives a differentiated clock signal CLKdif. As shown in FIG. 10, the LC filter 34 or 35 includes a diode 37, an inductor 38 and a capacitor 39. A diode-equipped LC filter is an output smoothing circuit generally employed for the output stage of a switching regulator.

The voltage comparator 36 compares a voltage Vdif outputted by the LC filter 34 with a voltage Vthi outputted by the LC filter, and generates a differential signal DIF in response to the obtained difference (Vthi−Vdif). It should be noted that the voltage comparator 36 may always compare the two voltages Vdif and Vthi, or may compare them at a specific timing in each predetermined cycle.

Figure 11:
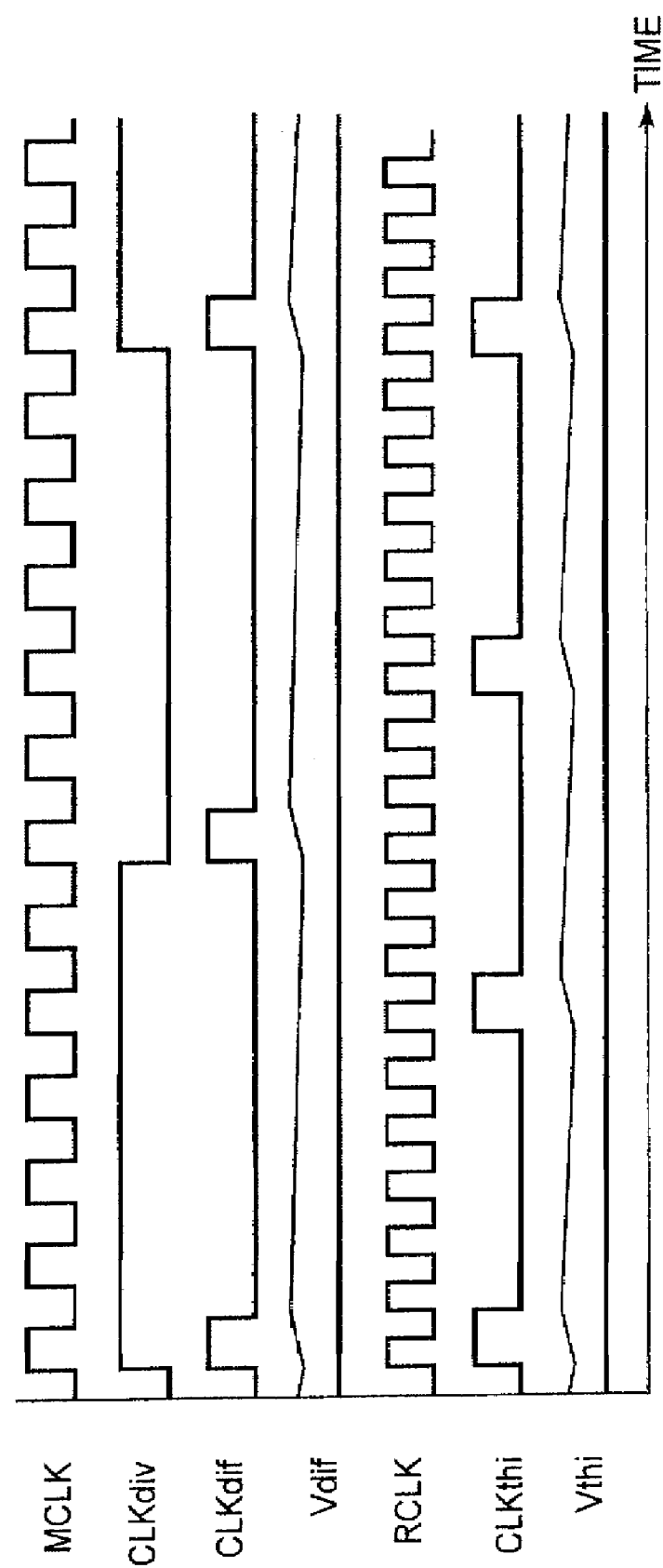
FIG. 11 is a timing chart showing the operation of the frequency comparison circuit shown in FIG. 10.

As shown in FIG. 11, during a period in which the differentiated clock signal CLKdif is at level H, the capacitor 39 is charged, and the output voltage Vdif of the LC filter 34 is gradually raised. On the other hand, during a period in which the differentiated clock signal CLKdif is at level L, the capacitor 39 is discharged, and the output voltage of the LC filter 34 is gradually dropped. The same phenomena are applied for the output voltage Vthi of the LC filter 35. Since the amplitudes of the output voltages Vdif and Vthi are extremely small, they are enlarged in FIG. 11 in order to easily understand. The voltage comparator 36 compares the output voltages Vdif and Vthi, and outputs a differential voltage in accordance with the obtained difference.

In this embodiment, the thinned-out clock signal CLKthi is directly transmitted to the LC filter 34, and the differentiated clock signal CLKdif is directly transmitted to the LC filter 35. However, inverters 32 and 33 may be arranged respectively at the input stages of the LC filters 34 and 35. The duty ratios for the thinned-out clock signal CLKthi and the differentiated clock signal CLKdif in FIG. 11 are small; however, when the duty ratios are great, it is preferable that the inverters 32 and 33 be additionally arranged. In this case, the periods for charging and discharging the capacitor 39 are reverse to those in the above described case.

According to the second embodiment, since the pulse number comparison circuit 24 is constituted substantially by an analog circuit, the circuit arrangement is simpler than for the first embodiment wherein the pulse number comparison circuit 24 is constituted substantially by a digital circuit.

For the above embodiments, the LSI 13 has incorporated the frequency comparison circuit 18 and the internal power supply circuit 19. However, these circuits need not be always incorporated in the LSI 13, and may be mounted on the printed wiring board 11. Further, while the ring oscillator 17 has been employed in the above embodiments, an LC oscillator that includes a transistor may be employed instead of the ring oscillator 17.

The embodiments of the present invention have been described; however, these embodiments are merely examples for carrying out the present invention. The present invention is not limited to the above embodiments, and the embodiments can be variously modified without departing from the subject of the invention.

The invention claimed is:

1. A semiconductor integrated circuit device, comprising:
a semiconductor substrate;
an oscillator formed on said semiconductor substrate, and for outputting a monitoring clock signal, said monitoring clock signal having a frequency that depends on a manufacturing process;
an internal circuit formed on said semiconductor substrate;
a frequency comparison circuit for comparing the monitoring clock signal outputted by said oscillator with a reference clock signal having a certain frequency, and for outputting a differential signal corresponding to the difference between the frequencies of the monitoring clock signal and the reference clock signal, wherein the frequency comparison circuit includes:
a pulse thinning circuit for outputting a thinned-out clock signal by thinning out (n−2) pulses for every n pulses included in the reference clock signal, and for maintaining two pulses;
a frequency dividing circuit for frequency-dividing the monitoring clock signal to a 1/n frequency thereof, and for outputting a frequency-divided clock signal;
a differentiating circuit for differentiating the frequency-divided clock signal outputted by said frequency dividing circuit in synchronization with the reference clock signal, and for outputting a differentiated clock signal;
a pulse number comparison circuit for comparing the number of pulses of the thinned-out clock signal outputted by said pulse thinning circuit with the number of pulses of the differentiated clock signal outputted by said differentiating circuit, and for generating the differential signal in accordance with the obtained difference; and
an internal power supply circuit for supplying an internal power voltage to said internal circuit, corresponding to the differential signal outputted by said frequency comparison circuit.

2. The semiconductor integrated circuit device of claim 1, wherein the pulse number comparison circuit includes:
a first counter for counting the number of pulses of the thinned-out clock signal;
a second counter for counting the number of pulses of the differentiated clock signal;
a subtracter for calculating a difference between the number of pulses obtained by said first counter and the number of pulses obtained by said second counter; and
a digital/analog converter for performing digital-analog conversion for the pulse number difference obtained by said subtracter to obtain the differential signal.

3. The semiconductor integrated circuit device of claim 1, wherein the pulse number comparison circuit includes:
a first LC filter for receiving the thinned-out clock signal;
a second LC filter for receiving the differentiated clock signal; and
a voltage comparator for comparing the output voltage of said first LC filter with the output voltage of said second LC filter, and for generating the differential signal in accordance with the difference between the output voltages.

* * * * *